US010866621B2

(12) United States Patent
Selvidge et al.

(10) Patent No.: US 10,866,621 B2
(45) Date of Patent: Dec. 15, 2020

(54) HINGED DIMM COOLING DEVICE (71) Applicant: HEWLETT PACKARD ENTERPRISE DEVELOPMENT LP, Houston, TX (US)

(72) Inventors: David A. Selvidge, Cypress, TX (US); Pinche Tsai, Richardson, TX (US); David Scott Chialastri, Houston, TX (US); Minh H. Nguyen, Katy, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/256,314

(22) Filed: Jan. 24, 2019

(65) Prior Publication Data
US 2020/0241609 A1 Jul. 30, 2020

(51) Int. Cl.
*H05K 7/20* (2006.01)
*H01L 23/40* (2006.01)
*H01L 23/427* (2006.01)
*G06F 1/20* (2006.01)
*G11C 5/04* (2006.01)
*H05K 1/02* (2006.01)

(52) U.S. Cl.
CPC ............... *G06F 1/20* (2013.01); *G11C 5/04* (2013.01); *H01L 23/4093* (2013.01); *H01L 23/427* (2013.01); *H05K 1/0209* (2013.01); *H05K 7/208* (2013.01); *H05K 7/20327* (2013.01); *H05K 7/20336* (2013.01); *G06F 2200/201* (2013.01); *G06F 2200/203* (2013.01)

(58) Field of Classification Search
CPC .............. H05K 7/20336; H01L 23/427; H01L 23/4093
See application file for complete search history.

(56) References Cited

U.S. PATENT DOCUMENTS

| | | | |
|---|---|---|---|
| 7,965,509 B2 | 6/2011 | Campbell et al. | |
| 8,139,355 B2 * | 3/2012 | Motschman | H01L 23/4093 361/679.54 |
| 8,638,559 B2 | 1/2014 | Barina et al. | |
| 8,684,757 B2 * | 4/2014 | Bridges | H01R 12/721 439/196 |
| 9,245,820 B2 | 1/2016 | Goldrian et al. | |
| 9,437,518 B2 * | 9/2016 | Byun | H01L 23/3675 |
| 9,786,578 B2 | 10/2017 | Cox et al. | |
| 10,021,814 B2 | 7/2018 | Aoki et al. | |

(Continued)

OTHER PUBLICATIONS

Cooliit Systems, Inc., "Passive Coldplates Loop," 2018, pp. 1-6 (online), Retrieved on Oct. 17, 2018 at URL: <coolitsystems.com/passive-coldplate-loop/>.

*Primary Examiner* — Hung V Ngo
(74) *Attorney, Agent, or Firm* — McDermott Will & Emery (57) ABSTRACT

A device assembly as disclosed herein includes a heat pipe coupled to a heat transfer device, and a thermal interface. The assembly further includes a cold plate rotatably coupled with the heat pipe through a hinge. The thermal interface is coupled with the cold plate through a plane to rotate about the heat pipe together with the cold plate, and the thermal interface includes a material having a thickness and a resiliency configured to make thermal contact with a circuit in a circuit card when the cold plate is rotated over the circuit card. A chassis and a method to build the chassis including the above assembly are also disclosed.

19 Claims, 9 Drawing Sheets

(56) References Cited

U.S. PATENT DOCUMENTS

| | | |
|---|---|---|
| 10,705,578 B2 * | 7/2020 | Franz ................. H01L 21/4882 |
| 2011/0209855 A1 | 9/2011 | Peterson et al. |
| 2018/0254234 A1 * | 9/2018 | Limaye ............... H01L 23/3675 |

* cited by examiner

HINGED DIMM COOLING DEVICE

BACKGROUND

Systems for cooling circuit cards for high power demanding computing applications (e.g. central processing unit—CPU—farms in computer servers, and the like) use heat pipes or thermal interface materials that are placed on circuit cards and other components. These configurations make it difficult to easily and rapidly access the circuit cards or other components for replacement, modifications, or any other maintenance tasks.

BRIEF DESCRIPTION OF THE DRAWINGS

The accompanying drawings, which are included to provide further understanding and are incorporated in and constitute a part of this specification, illustrate disclosed embodiments and together with the description, serve to explain the principles of the disclosed embodiments. In the drawings.

In the figures, elements and steps denoted by the same or similar reference numerals are associated with the same or similar elements and steps, unless indicated otherwise.

DETAILED DESCRIPTION

In the following detailed description, numerous specific details are set forth to provide a full understanding of the present disclosure. It will be apparent, however, to one ordinarily skilled in the art, that the embodiments of the present disclosure may be practiced without some of these specific details. In other instances, well-known structures and techniques have not been shown in detail so as not to obscure the disclosure.

General Overview

Continuous cooling system designs are desirable in current computational applications involving rapidly increasing device power levels. Moreover, given the complexity of current computer systems, it is desirable that cooling designs, in addition to efficiently removing heat from the circuit components, be placed in a manner that facilitates the removal and replacement of the component. This property of cooling systems is highly desirable in memory cards, e.g., dual in-line memory module (DIMM) cards, peripheral component interconnect express (PCIE) cards, and the like, which are inserted in sockets and easily removed with thumb latches.

Embodiments as disclosed herein provide cooling designs and assemblies that provide efficient cooling to circuit cards and components in computer systems, without interfering in the installation, replacement and removal of the cards from the chassis. Further, some embodiments include a serviceable way to provide a heat transfer plate to circuit cards on a printed circuit board (PCB) or chassis, and coupling the heat transfer plate with a liquid cooling loop, when this is available.

In particular, in various example cooling assemblies disclosed herein, a generally plate-shaped thermal element (hereinafter "thermal plate") for cooling the circuit card is coupled at one end to a generally cylinder-shaped thermal element (hereinafter "thermal cylinder") that runs parallel to the circuit card adjacent the socket into which the circuit card is plugged. The thermal plate transfers heat to the thermal cylinder, and the thermal cylinder transfers heat to a cooling medium (either directly or via additional thermal elements) to remove the heat from the system.

Notably, the thermal plate is connected to the thermal cylinder so as to be able to rotate about the thermal cylinder. For example, the thermal plate may include a hollow channel running lengthwise through the plate at one end thereof, and the thermal cylinder may be sheathed within the channel. The rotatable connection enables the thermal plate to be rotated between two configurations: one configuration in which the thermal plate can couple with a face of the circuit card to remove heat from the circuit card, and another in which the thermal plate is well clear of the circuit card to allow easily access for insertion, removal, and/or servicing of the circuit card. Thus, effective cooling of the circuit component can be provided while also enabling ease of access to the circuit component.

In some example cooling assemblies disclosed herein, there are included multiple of the thermal plates connected, respectively, to multiple thermal cylinders. Furthermore, in some examples, pairs of thermal plates may be arranged to face or oppose one another, such that a pair of thermal plates thermally couple to opposite faces of the same circuit card. For example, example cooling assemblies for cooling memory modules (e.g., DIMMs) may include a pair of thermal plates and corresponding thermal cylinders for each memory module, with the thermal cylinders interleaved between the memory module sockets.

In some examples, the thermal cylinders are heat pipes, which are connected to a cooling device. The heat pipes transfer heat to the cooling device, which transfers the heat into a cooling medium of a cooling system. The cooling device may be, for example, a cold plate of a liquid cooling system, a thermal bus bar of a dry-disconnect liquid cooling system, or a heat sink of an air cooling system.

In some examples, the thermal cylinders are coolant tubes through which flows liquid coolant of a liquid cooling system. In such examples, heat is transferred directly from the coolant tubes into the liquid coolant. The coolant tubes may be connected into a liquid coolant flow of the liquid cooling system by inlet and outlet manifolds.

In a first embodiment, an assembly as disclosed herein includes a heat pipe coupled to a heat transfer device, and a thermal interface. The assembly further includes a cold plate rotatably coupled with the heat pipe through a hinge. The thermal interface is coupled with the cold plate through a plane to rotate about the heat pipe together with the cold plate, and the thermal interface includes a material having a thickness and a resiliency configured to make thermal contact with a circuit in a circuit card when the cold plate is rotated over the circuit card.

In a second embodiment, a chassis includes a liquid manifold, multiple circuit cards having a vertical connector to fit into multiple sockets on the chassis, and multiple assemblies configured to receive the circuit cards. Each of the assemblies includes a heat pipe coupled to a heat transfer device, a thermal interface, and a cold plate rotatably coupled with the heat pipe through a hinge. The thermal interface is coupled with the cold plate through a plane to rotate about the heat pipe together with the cold plate, the thermal interface includes a material having a thickness and a resiliency configured to make thermal contact with a circuit in one of the circuit cards, and one of the circuit cards is inserted in a socket and is configured to make thermal contact, on each of two opposite sides, with a thermal interface of each of two assemblies.

In another embodiment, a method includes disposing two heat pipes in parallel along either side of a socket for a circuit card on the chassis, and thermally coupling one end of the heat pipes with a heat transfer device on the chassis. The method also includes rotatably coupling two cold plates with the heat pipes, the two heat pipes acting as hinges and heat sinks for the two cold plates, disposing two thermal layers on sides of the two cold plates facing each other, the two thermal layers formed of a resilient material, and disposing a latch on an edge of the socket, between the two heat pipes, the latch configured to exert a releasing force, upon pressure, when a circuit card is set in the socket.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Example System Architecture

Figure 1:
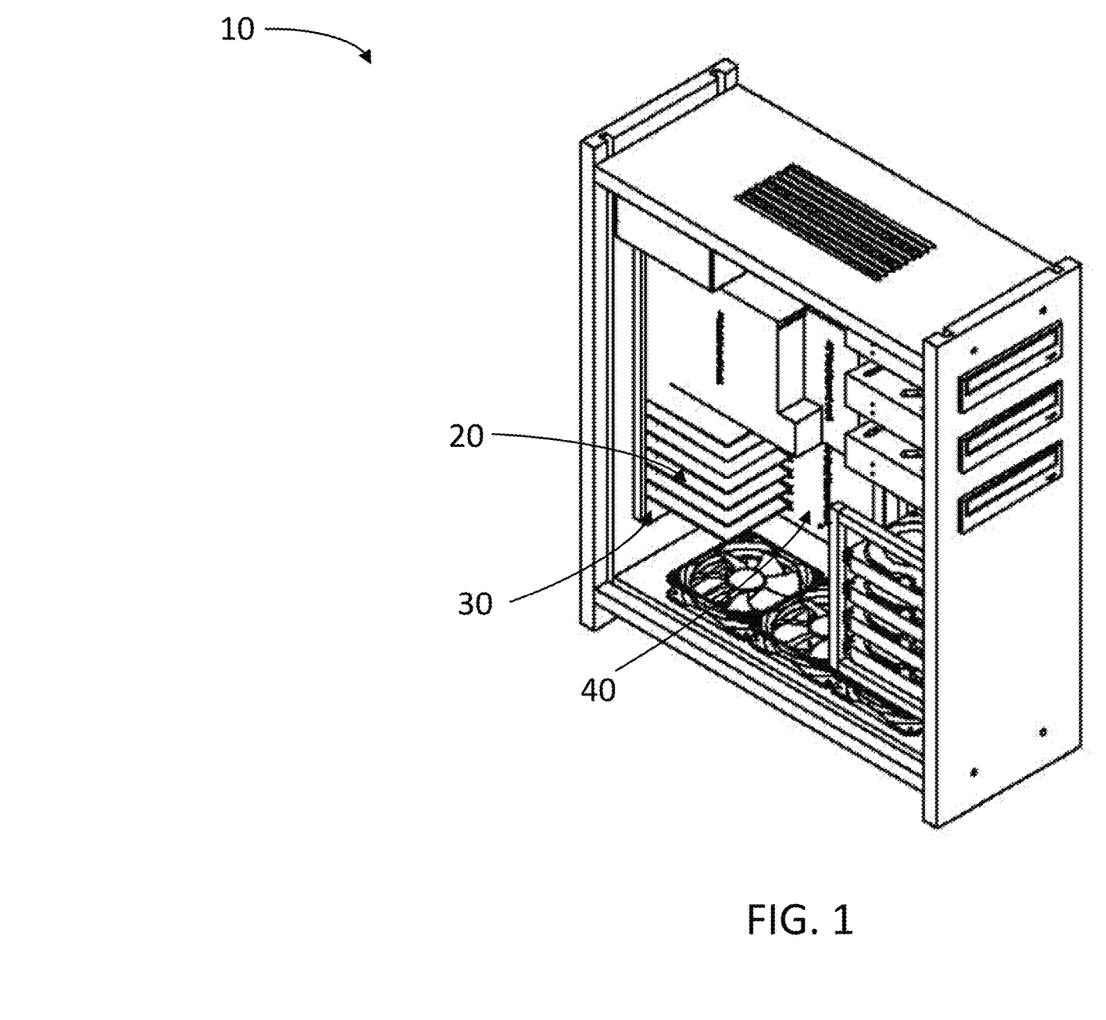
FIG. 1 illustrates a computer system including circuit cards mounted on a chassis with a hinged cooling device, according to some embodiments.

FIG. 1 illustrates a computer system 10 including circuit cards 20 mounted on main printed circuit board (PCB) 40 in a chassis 30 with a hinged cooling device (not visible in FIG. 1), according to some embodiments. In some embodiments, circuits in circuit cards 20 may include one of a dual in-line memory module (DIMM) or other similar memory or storage devices including multiple volatile and non-volatile memory circuits including a dynamic random access memory and a NAND flash memory.

In some embodiments, circuit cards 20 may include a symmetric board including like circuits on opposite sides of circuit cards 20. PCB 40 may include multiple sockets into which the circuit cards 20 may be inserted to electrically connect the circuit cards 20 to the PCB 40. The close proximity to one another of circuit cards 20 leads to a high heat concentration in the arrangement of computer system 10. To remove the heat, some embodiments include complex cooling assemblies that desirably are closely placed to each of circuit cards 20. Moreover, in some embodiments, in addition to the high heat transfer efficiency, another beneficial feature added is a simplicity for any operator to access each and every one of circuit cards 20 (or at least one, according to some embodiments) and remove it, replace it, or add it to chassis 30.

Figure 2:
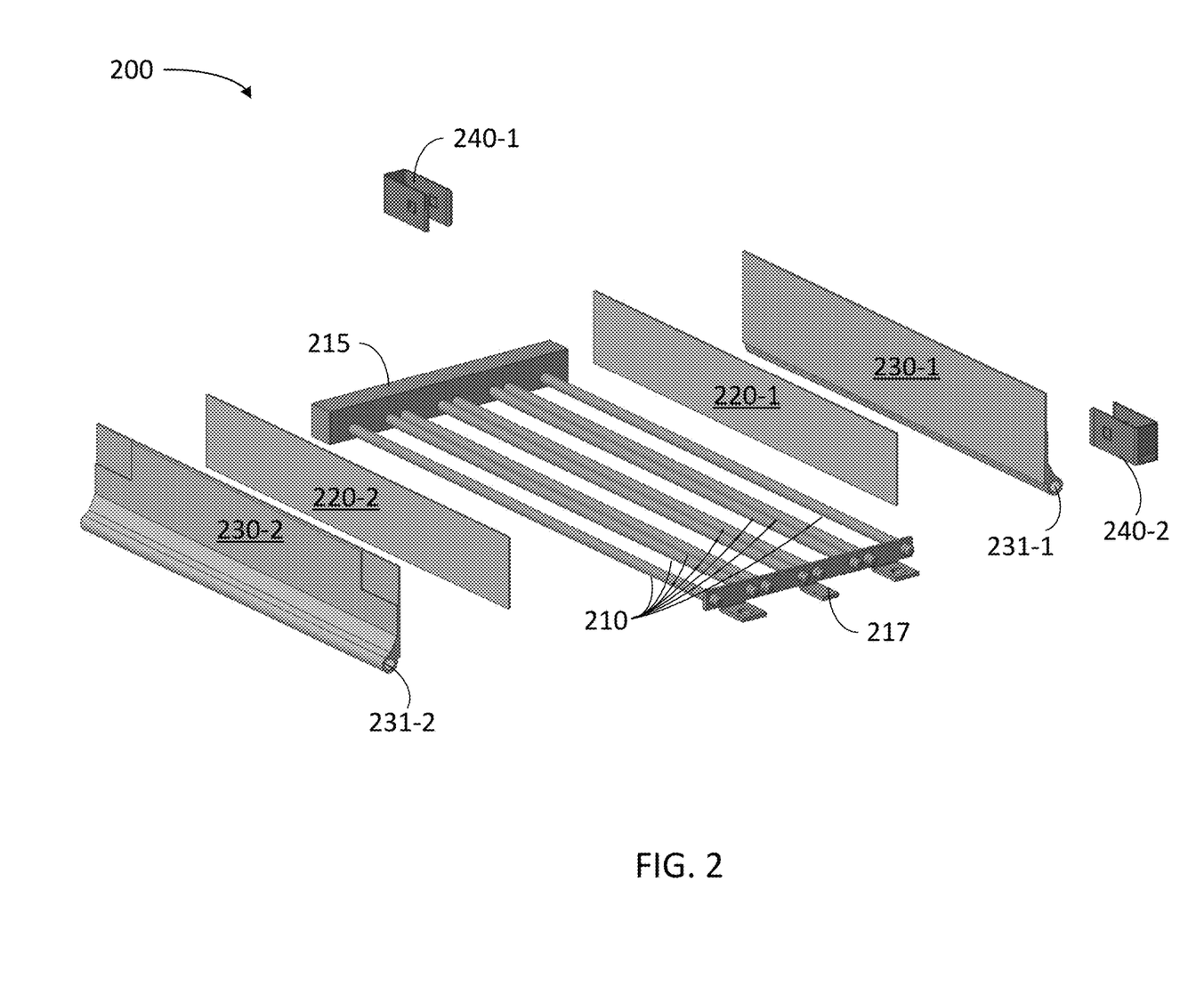
FIG. 2 illustrates components in an assembly for a hinged cooling mount, according to some embodiments.

FIG. 2 illustrates components in an assembly 200 for a hinged cooling mount, according to some embodiments. Accordingly, assembly 200 may be part of a chassis configured to mount multiple circuit cards in a computer system (e.g., computer system 10, circuit cards 20, and chassis 30).

Thermal cylinders 210 are coupled to a heat transfer device 215. In some embodiments, thermal cylinders 210 are heat pipes (in which case, they may be referred to as "heat pipes 210"). In general, heat pipes are thermal devices that include a working fluid inside an interior channel, such that when the heat pipe is placed in contact with a heat source the working fluid near the heat source absorbs heat from the walls of the heat pipe causing it to vaporize, and the vapor flows throughout the channel until it contacts a colder portion of the heat pipe whereupon it condenses back into liquid form and gives up heat into the walls of the heat pipe. The liquid coolant is then wicked back towards the hot portion of the heat pipe through a wicking structure, such as sintered powder, grooves, mesh, etc. Thus, the working fluid goes through a cycle of vaporization, condensation, and wicking, and thereby transfers heat. The heat transfer device 215 may be a device that transfers the heat received from the heat pipes 210 into a cooling system of the computer. For example, the heat transfer device 215 may be (or may be thermally coupled to) a cold plate to transfer heat into liquid coolant of a liquid cooling system. As another example, the heat transfer device 215 may be (or may be thermally coupled to) a heat sink of an air cooling system. In some embodiments, the heat transfer device 215 may be a vapor chamber device, and the interior channels of the heat pipes 210 may be fluidically coupled with an interior chamber of the heat transfer device 215, in what may be called a 3D vapor chamber arrangement. The heat pipes 210 may be supported at one end by the heat transfer device 215 and at the other end by a clip 217. The clip 217 may attach the heat pipes 210 to a PCB of the computer system.

In some examples, the thermal cylinders 210 may be liquid coolant lines through which liquid coolant of a liquid cooling system may flow. In such examples, the heat transfer device 215 may be a liquid manifold and interiors of the thermal cylinders 210 may be communicably connected with the interior of the liquid manifold. The heat transfer device 215 (liquid manifold) may be configured to receive the liquid coolant flowing through the thermal cylinders 210 and outlet the liquid coolant to a liquid coolant return line of the liquid cooling system. In addition, another liquid manifold (not illustrated) may also be included at an opposite end of the thermal cylinders 210, in addition to or in lieu of the clip 217, and may be communicably connected to an interior of the thermal cylinders 210. The additional manifold may be configured to receive an inflow of liquid coolant from a liquid supply line of the liquid cooling system and provide the liquid coolant to the thermal cylinders 210. Thus, the thermal cylinders 210 may be integrated into a liquid coolant loop of a liquid cooling system via the liquid manifolds. In such examples, heat flows from the circuit cards into the thermal plates 230, from the thermal plates 230 into the walls of the thermal cylinders 210, and from the walls of the thermal cylinders 210 into the liquid coolant.

In some examples, the thermal cylinders 210 may be a solid or hollow piece of conductive material (e.g., copper) that conducts the heat from the thermal plates 230 to the heat transfer device 215 via simple conduction.

Assembly 200 may also include thermal interfaces 220-1 and 220-2 (hereinafter, collectively referred to as "thermal interfaces 220"). In some embodiments, thermal interfaces 220 are made of a resilient material that is also a good thermal conductor. Accordingly, in some embodiments, a thickness of thermal interfaces 220 is selected based on a profile of the circuits in the circuit card and a selected heat transfer rate. For example, commercially available thermal interface materials ("TIMs") may be used as the thermal interfaces 220, such as thermal pads (aka gap pads), thermal pastes, thermal greases, etc.

Thermal plates 230-1 and 230-1 (hereinafter, collectively referred to as "thermal plates 230") rotatably coupled with heat pipe 210 through hinges 231-1 and 231-2 (hereinafter, collectively referred to as "hinges 231"). In some embodiments, thermal plates 230 may be "cold plates" configured to receive heat from a heat source and transfer the heat to a cooler element. Thermal plates 230 are formed of a good thermal conducting material, such as a metal, The thickness, width, and length of thermal plates 230 is selected based on a desired thermal dissipation, and also on the form factor of the circuit card that will be pressed therebetween. In some embodiments, thermal plates 230 are thermally coupled with heat pipes 210 through hinges 231. Hinges 231 may have a cylindrical form factor, to enable thermal plates 230 to rotate, at least partially, about heat pipes 210.

In some embodiments, a thermal interface material may be disposed between heat pipes 210 and thermal plates 230. The thermal interface material may provide low friction for ease of rotation of thermal plate 230 around heat pipe 210. Further, the thermal interface material may enable and enhance heat transfer from thermal plate 230 to heat pipe 210, through hinges 231. In some embodiments, the thermal interface material may include a thermal grease having a viscosity in the range of 50-150 Pascal-second (Pa-Sec). For example, and without limitation, some embodiments may include a thermal grease in hinges 231 interfacing thermal plates 230 and heat pipes 210 having low thermal resistance (e.g., high thermal conductivity). The bond line thickness (BLT) of the thermal interface material may be as low as 0.02 mm, or even less, which may be desirable in some embodiments, as a lower BLT increase the rate of heat transfer through the thermal interface material. Some materials used for the thermal interface material in hinges 231 may include silicone materials heavily filled with heat-conductive metal oxides, which is a combination that enhances thermal conductivity.

The materials used in thermal plates 230 may vary according to space available for a chassis on different applications. In embodiments using a chassis under tight spatial constraints thermal plates 230 are desirably thin. Accordingly, a desirable material for thermal plates 230 may be extruded aluminum including a main cooling surface wall of about 1.0 mm thickness, or even less. In embodiments with a more relaxed spatial tolerance, copper may be a preferred material because of the higher thermal conductivity. However, thermal plates 230 made out of copper may require thicker walls to provide the desirable strength, as copper is a softer material as compared to extruded aluminum. In yet other embodiments, steel may be used for thermal plates 230 that are even thinner than aluminum plates.

More generally, the materials, thicknesses, and form factors of thermal plates 230 and thermal interfaces 220 may vary over a wide range, compromising the weight of the entire assembly with the spatial constraints and the thermal conductivity of the materials.

Thermal interfaces 220 are coupled with thermal plates 230, and thus rotate about heat pipes 210 together with thermal plates 230. In some embodiments, thermal interface 220 includes a material having a thickness and a resiliency configured to make thermal contact with a circuit in a circuit card when thermal plates 230 are rotated over the circuit card. The two assemblies including thermal plates 230 and thermal interfaces 220 are configured to rotate in opposite directions about a respective heat pipe to allow for an insertion and a removal of the one of the circuit cards.

In some embodiments, assembly 200 includes clips 240-1 and 240-2 (hereinafter, collectively referred to as "clips 240"), configured to maintain a pressure of the thermal plate and the thermal interface over the circuit card. In some embodiments, clips 240 maintain a pressure of the thermal plate and the thermal interface over the circuit card.

Figure 3:
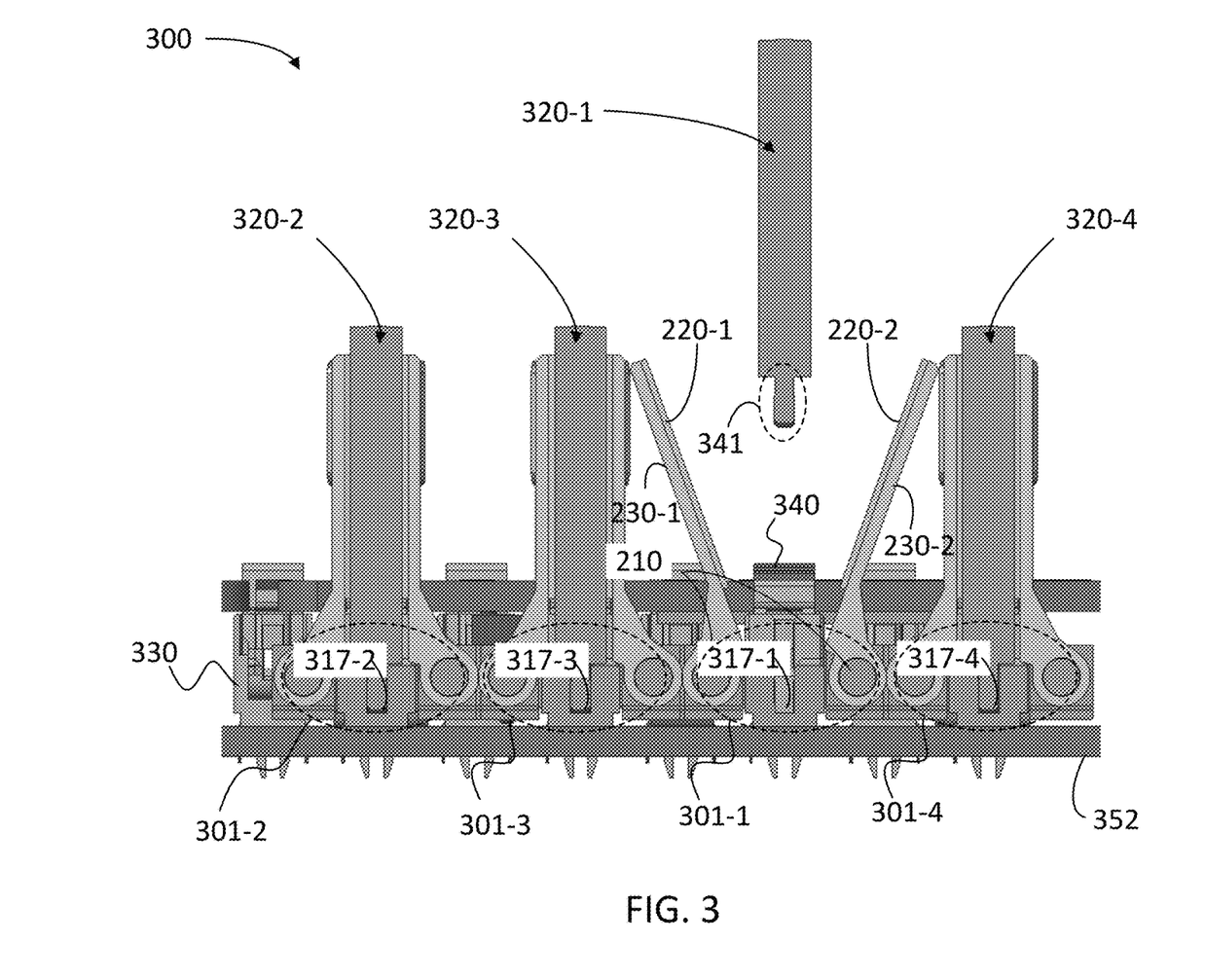
FIG. 3 illustrates a circuit card dismounted from a chassis with hinged cooling mounts, according to some embodiments.

FIG. 3 illustrates an example implementation of the assembly 200 installed on a PCB 352 of a computing system 300 to cool example circuit cards 320. In the example of FIG. 3, the assembly 200 includes multiple sub-assemblies 301, with each sub-assembly 301 including a pair of thermal plates 230 and a pair of thermal cylinders 210 to which the pair of thermal plates 230 are connected. Each sub-assembly 301 is to cool one of the circuit cards 320. In particular, the thermal cylinders 210 of a sub-assembly 301 are arranged on opposite sides of a socket 317 into which the circuit cards 320 are to be installed, and the thermal plates 230 face one another such that they can contact opposite sides of the circuit card 320 when it is installed in the socket 317. In FIG. 3, one of the circuit cards 320, namely the circuit card 320-1, is shown in an uninstalled stated, while the other circuit cards 320 are shown in an installed state. Furthermore, in FIG. 3, one of the sub-assemblies 301, namely the sub-assembly 301-1, is shown with the thermal plates 230 rotated into an open configuration that allows for the circuit card 320-1 to be installed in the socket 317-1. Similar sockets 317-2, 317-3 and 317-4 (collectively referred to, hereinafter, as assemblies 301) may be found in assemblies 301-2, 301-3, and 301-4, respectively. The circuit cards 320 illustrated in FIG. 3 have a vertical connector 341 to fit into one of the sockets 317 on PCB 352. Sub-assemblies 301 also include two thermal interfaces 220 on the thermal plates 230.

Sockets 317 may be soldered onto a PCB 352 that has electrical connections and couplings between other components in computing system 300 and circuits in circuit boards 320. Some embodiments may include other circuits mounted on PCB 352.

In some embodiments, circuit cards 320 are removably coupled to sockets 317. Each of the two thermal plates 230 in sub-assemblies 301 is configured to rotate in opposite directions about a respective heat pipe 210 to allow for an insertion and a removal of circuit card 320-1 into and from socket 317. To remove circuit card 320-1 from socket 317, a latch 340 (e.g., a thumb latch) is manually pressed by a user or technician. Latch 340 is configured to exert a releasing force on vertical connector 341 and push circuit card 320-1 upward, thus releasing the circuit card from chassis 300. In FIG. 3, only one latch 340 is illustrated to avoid obscuring other features in the Figure, but it should be understood that each socket 317 could have a similar latch 340. In addition, latches 340 could be provided at both ends of each socket 317.

While circuit cards 320 are shown vertically positioned relative to chassis 300, other configurations may be available, at different angles from a direction normal to the plane of chassis 300. The choice of angular orientation of assemblies 301 may be determined based on spatial availability, or even on a desire to provide an air flow therebetween, for further cooling of the entire mounting. In some embodiments, the cooling effect provided by assemblies 301 through heat pipes 210 may be sufficient, so that the orientation of circuit cards 320 may be twisted at an angle, to fit more circuit cards in chassis 300.

Figure 4:
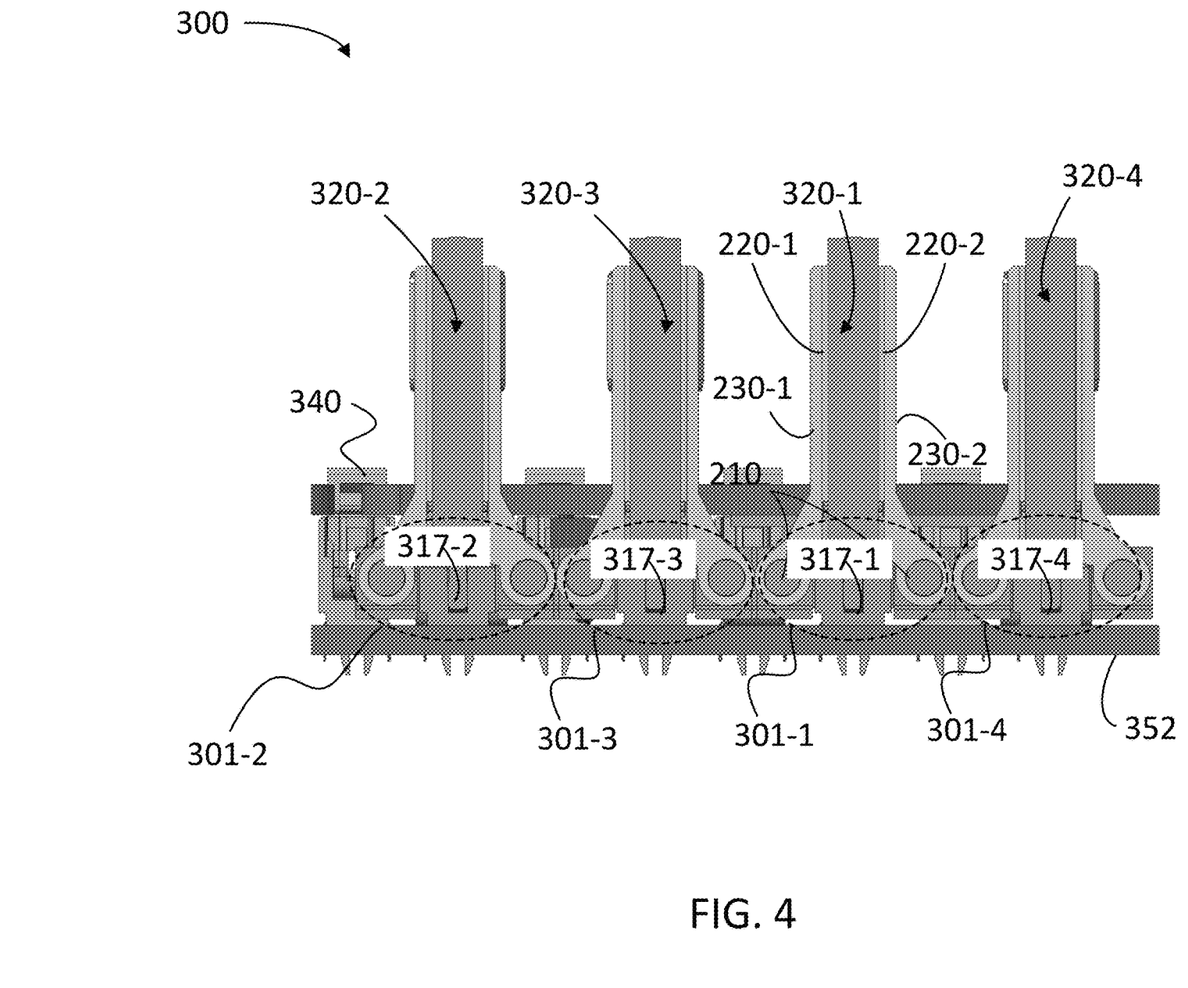
FIG. 4 illustrates multiple circuit cards mounted on a chassis with hinged cooling mounts, according to some embodiments.

FIG. 4 illustrates the example implementation of FIG. 3 in a state in which the circuit card 320-1 has been installed in the socket 317 and the sub-assembly 301-1 is in a closed configuration.

Figure 5:
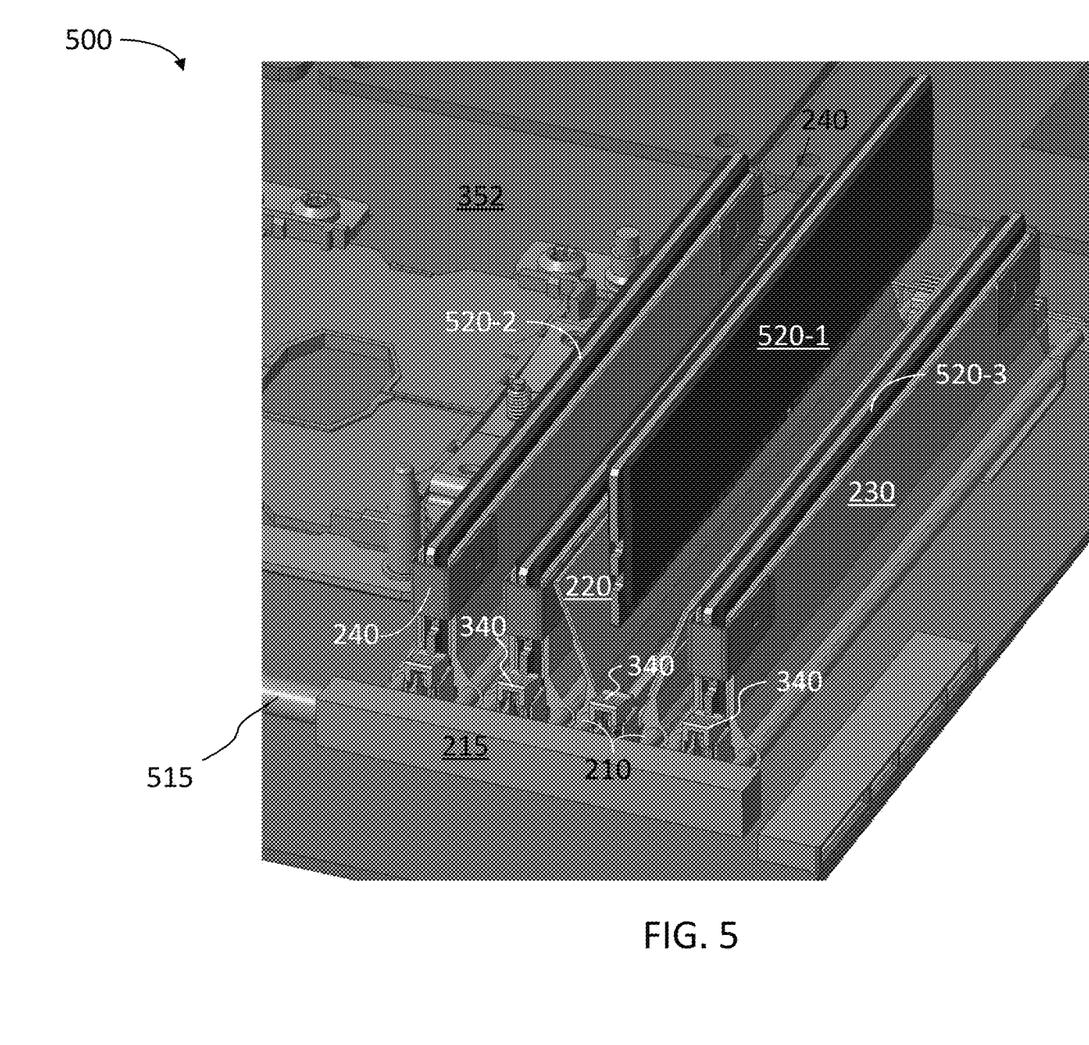
FIG. 5 illustrates a DIMM card dismounted from a chassis with hinged cooling mounts, according to some embodiments.

FIG. 5 illustrates an example implementation of the assembly 200 installed on a PCB 352 of a computing system 300. The example of FIG. 5 is a more detailed implementation example than the example of FIG. 3. In particular, in FIG. 5 the circuit cards 320 are specifically DIMM cards 520, and the assembly 200 is connected into a liquid cooling system by way of a cooling line 515. The heat transfer device 215 is connected to a cooling line 515 containing a liquid flow to remove heat from the heat transfer device 215. For example, the heat transfer device 215 may include a chamber through which the liquid coolant may flow and contact a hot surface of the heat transfer device 215, thereby enabling transfer of heat from the hot surface to the liquid coolant. In some embodiments, cooling line 515 is coupled to a pump configured to provide a liquid flow to transfer heat from heat pipe 210.

Thermal interface 220 closes in on DIMM card 520-1 by rotating thermal plate 230 about heat pipe 210.

Accordingly, thermal interface 220 is formed of a material having a thickness and a resiliency configured to make thermal contact with a DRAM circuit in DIMM card 520-1. DIMM cards 520 are inserted in a socket and make thermal contact, on each of two opposite sides, with thermal interfaces 220. Clips 240 keep the assemblies including the two thermal plates 230 and the two thermal interfaces 220 securely packed and in thermal contact with one another. Moreover, in some embodiments thermal plates 230 are loosely coupled with DIMM cards 520, so that as soon as clips 240 are removed from the assembly, thermal plates 230 come apart to allow removal of DIMM cards 520 by simply pressing on latches 340.

Figure 6:
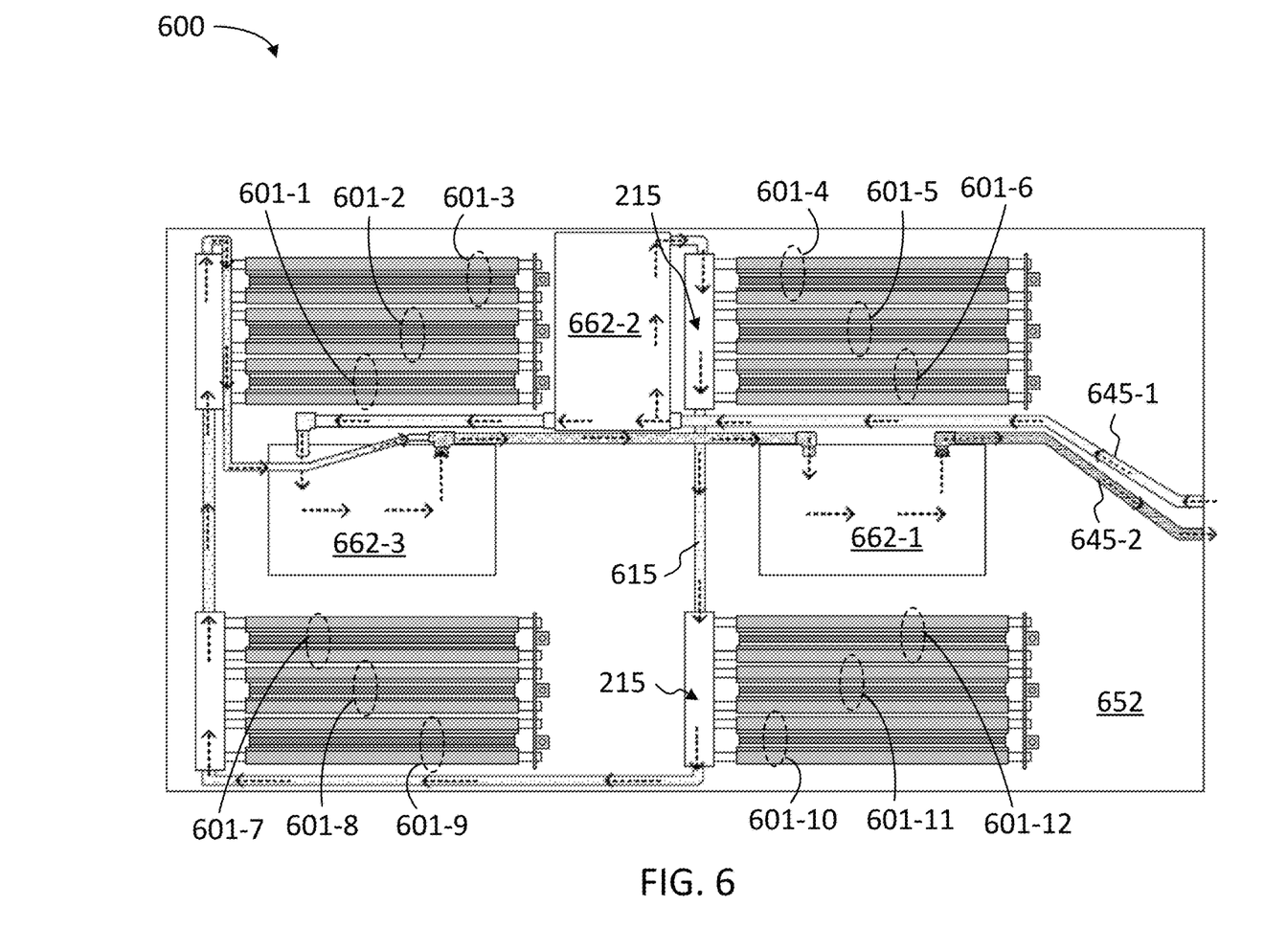
FIG. 6 illustrates multiple cooling assemblies on a chassis, according to some embodiments.

FIG. 6 illustrates an implementation example in which multiple assemblies 601-1 through 601-12 (hereinafter, collectively referred to as "assemblies 601") are included in a single computing device 600. In particular, the computing device 600 includes four cooling assemblies 200 for cooling DIMMs of the computing device, with each cooling assembly including three sub-assemblies to cool three DIMMs. The cooling assemblies 200 may be integrated into a liquid cooling loop of the computing device 600 to remove heat from the cooling assemblies 200. In particular, liquid coolant lines 615 are thermally coupled with each heat transfer device 215 to couple the heat transfer device 215 into the liquid cooling system. The liquid cooling system includes conduits 645-1 and 645-2 (hereinafter, collectively referred to as "conduits 645") for supplying and returning liquid coolant into and out of the computing device 600, and the liquid coolant lines 615 may be coupled into the conduits 645.

Conduits 645 provide a cooling fluid to heat transfer components 662-1, 662-2, and 662-3 (hereinafter, collectively referred to as "heat transfer components 662"). In some embodiment, heat transfer components 662 may be provided for cooling different active elements in chassis 652. For example, in some embodiments heat transfer component 662-1 may be used for cooling a processor, and heat transfer component 662-2 may be used for cooling a power converter.

Figure 7:
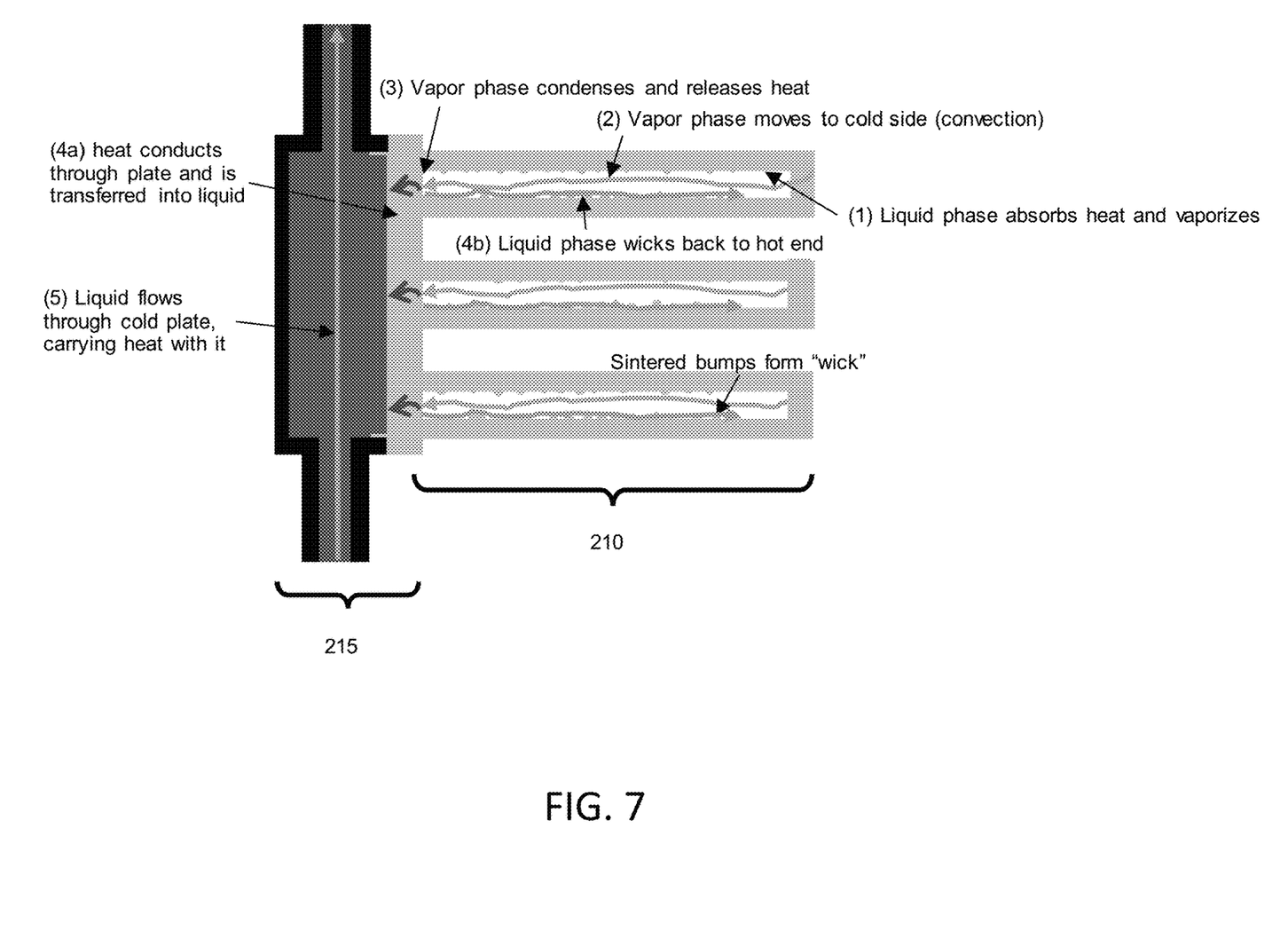
FIG. 7 illustrates example cooling assemblies integrated into an example liquid cooling system.
Figure 8:
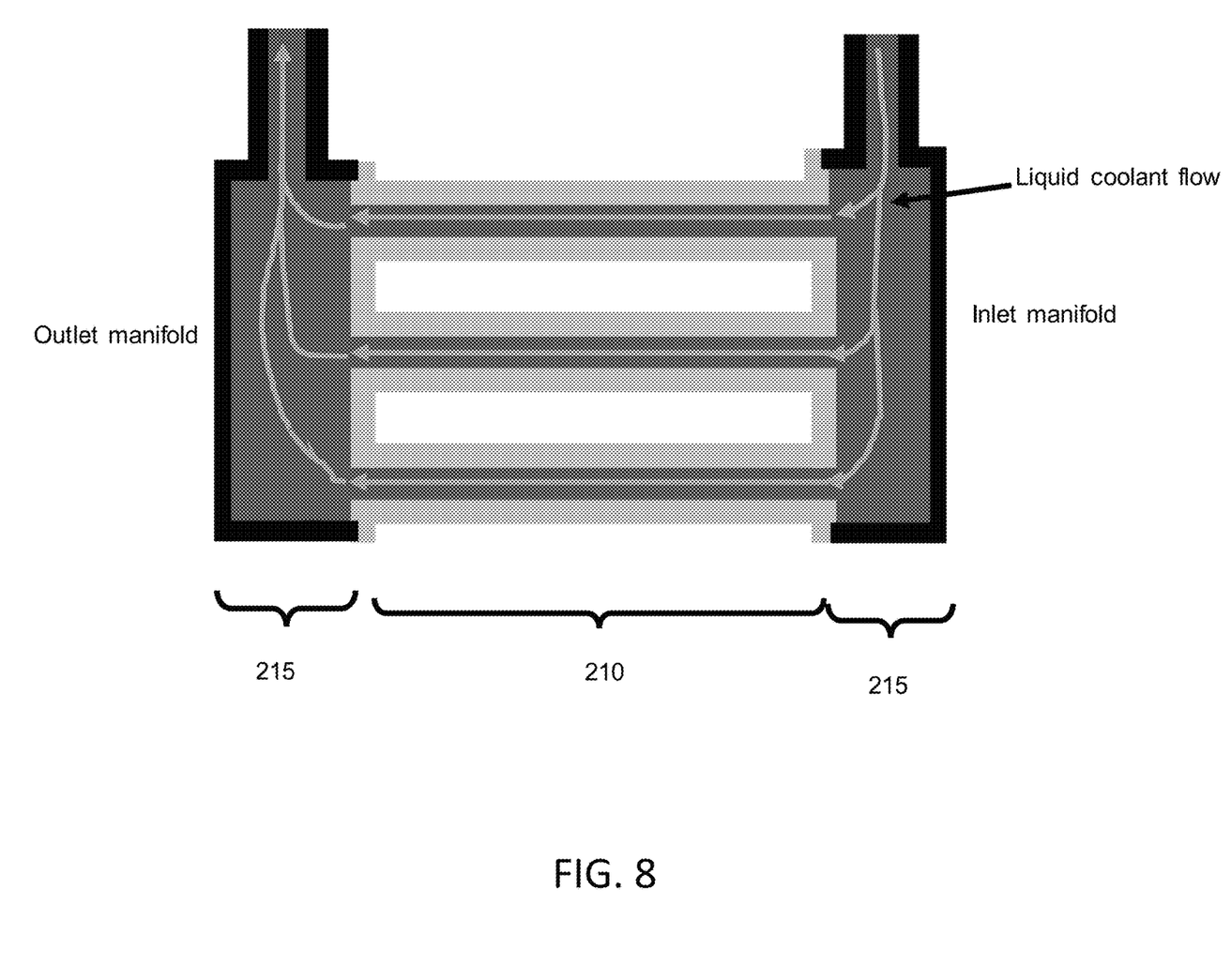
FIG. 8 illustrates example cooling assemblies integrated into another example liquid cooling system.

In particular, FIGS. 7 and 8 illustrate two examples of how the cooling assemblies 200 of FIG. 6 could be integrated into the liquid cooling system of the computing device 600. In FIG. 7, the thermal cylinders 210 are heat pipes, while in FIG. 8 the thermal cylinders 210 are tubes through which liquid coolant flows. In FIG. 7, each assembly 200 has one heat transfer device 215 that is connected into a liquid coolant loop of a liquid cooling system via the liquid coolant lines 615. In FIG. 8, each assembly 200 has two heat transfer devices 215, one at either end of the thermal cylinders 210, with one acting as an inlet manifold and one acting as an outlet manifold to enable liquid coolant to flow through the thermal cylinders 210. The liquid coolant loops illustrated in FIGS. 7 and 8 are merely examples, and any type of coolant loop may be used.

Figure 9:
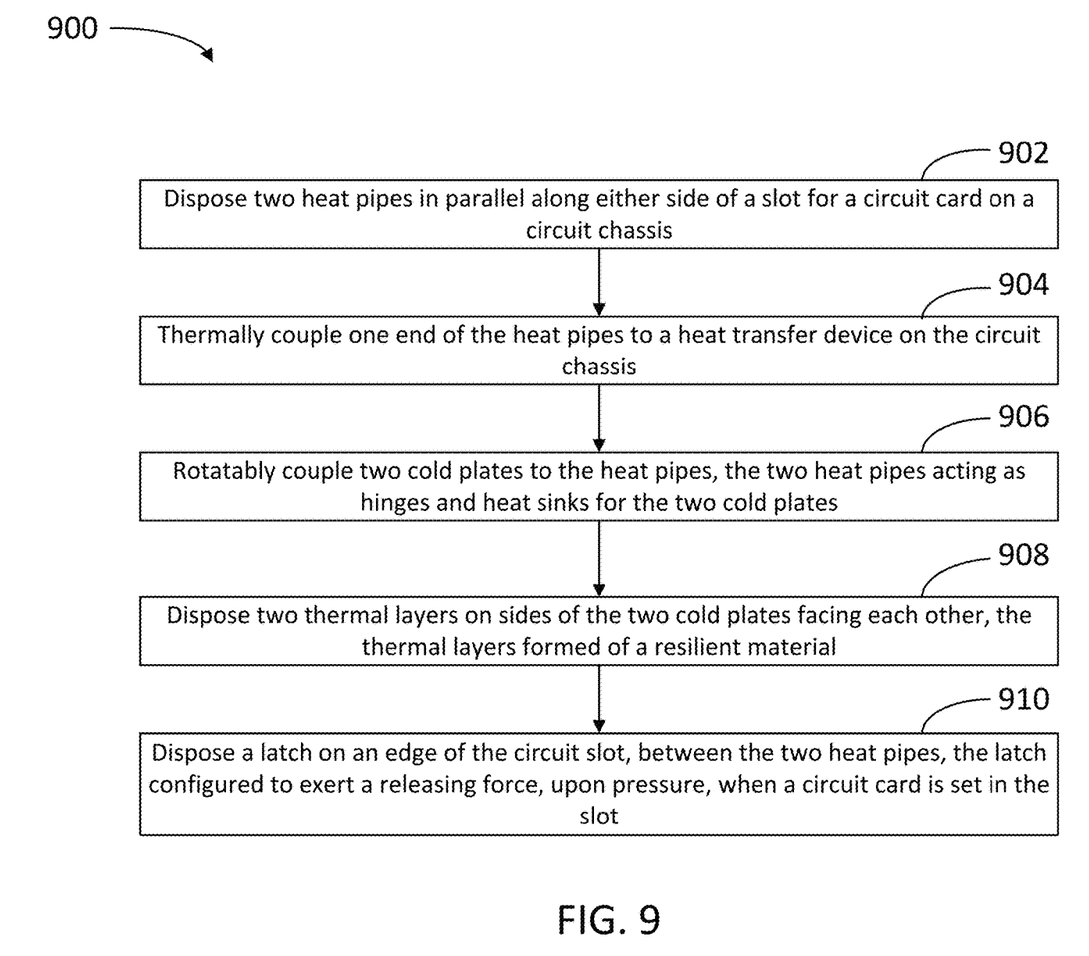
FIG. 9 is a flow chart illustrating steps in a method for assembling a system on a chassis, according to some embodiments.

FIG. 9 is a flow chart illustrating steps in a method 900 for assembling a system on a chassis, according to some embodiments (e.g., chassis 30, 300, 500 and 600). Consistent with some embodiments, the chassis may include a liquid manifold, multiple circuit cards having a vertical connector to fit into multiple sockets on the chassis, and multiple assemblies configured to receive the circuit cards (e.g., liquid manifold 515, circuit cards 320, vertical connector 341, sockets 317, and assemblies 301). Each of the assemblies may include a heat pipe coupled to a heat transfer device, a thermal interface, and a thermal plate rotatably coupled with the heat pipe through a hinge (e.g., heat pipes 210, heat transfer device 215, thermal interfaces 220, and thermal plates 230). The thermal interface may be coupled with the thermal plate through a plane to rotate about the heat pipe together with the thermal plate. Further, the thermal interface may include a thermal layer of a material having a thickness and a resiliency configured to make thermal contact with a circuit in one of the circuit cards. In some embodiments, one of the circuit cards is inserted in a socket and is configured to make thermal contact, on each of two opposite sides, with a thermal interface of each of two thermal plates in an assembly.

In some embodiments, a method consistent with the present disclosure may include at least one of the steps illustrated for method 900, performed in any order. For example, embodiments consistent with the present disclosure may include one or more steps in method 900 performed in parallel, simultaneously, quasi-simultaneously, or overlapping in time.

Step 902 includes disposing two heat pipes in parallel along either side of a socket for a circuit card on the chassis.

Step 904 includes thermally coupling one end of the heat pipes with a heat transfer device on the chassis.

Step 906 includes rotatably coupling two thermal plates with the heat pipes, the two heat pipes acting as hinges and heat sinks for the two thermal plates. In some embodiments, step 706 includes coupling each of the two thermal plates to rotate in an opposite direction. In some embodiments, step 706 includes applying a thermal interface material to the hinge of the thermal plate. For example, in some embodiments step 706 includes screen printing a thermally conductive grease over the surface of the heat pipe, or an inner surface of a hollow end of the thermal plate, or on both surfaces. In some embodiments, step 706 includes stencil printing the thermal interface material on one of the hinge surfaces, or dispensing the thermal interface material though a pressure nozzle.

Step 908 includes disposing two thermal layers on sides of the two thermal plates facing each other, the two thermal layers formed of a resilient material.

Step 910 includes disposing a latch on an edge of the socket, between the two heat pipes, the latch configured to exert a releasing force, upon pressure, when a circuit card is set in the socket. In some embodiments, step 710 includes fluidically coupling the heat pipe with the heat transfer device. In some embodiments, step 710 includes coupling a cooling fluid loop with the heat transfer device. In some embodiments, step 710 includes selecting a thickness of the thermal layers based on a height profile of a circuit component in the circuit card and a resiliency of the resilient material.

Multiple variations and modifications are possible and consistent with embodiments disclosed herein. Although certain illustrative embodiments have been shown and described here, a wide range of modifications, changes, and substitutions is contemplated in the foregoing disclosure. While the above description contains many specifics, these should not be construed as limitations on the scope of the embodiment, but rather as exemplifications of one or another preferred embodiment thereof. In some instances, some features of the present embodiment may be employed without a corresponding use of the other features. Accordingly, it is appropriate that the foregoing description be construed broadly and understood as being given by way of illustration and example only, the spirit and scope of the embodiment being limited only by the appended claims.

What is claimed is:

1. An assembly, comprising:
a heat pipe coupled to a heat transfer device;
a thermal interface;
a cold plate rotatably coupled with the heat pipe through a hinge, wherein the thermal interface is coupled with the cold plate through a plane to rotate about the heat pipe together with the cold plate, and the thermal interface comprises a material having a thickness and a resiliency configured to make thermal contact with a circuit in a circuit card when the cold plate is rotated over the circuit card; and
a second thermal interface coupled with a second cold plate, the second cold plate rotatably coupled with a second heat pipe, wherein the cold plate, and the second cold plate, are configured to press on the circuit card when they rotate against each other, and the second thermal interface is configured to make thermal contact with multiple chips on a surface of the circuit card.

2. The assembly of claim 1, wherein the heat transfer device comprises a liquid manifold containing a liquid flow.

3. The assembly of claim 2, wherein the liquid manifold is coupled to a pump configured to provide a liquid flow to transfer heat from the heat pipe.

4. The assembly of claim 1, wherein the heat pipe comprises a fluid configured to transfer heat from the circuit in the circuit card via evaporation of the fluid into a sintered portion of the heat pipe.

5. The assembly of claim 1, wherein the heat pipe is fluidically coupled with the heat transfer device.

6. The assembly of claim 1, wherein the cold plate is thermally coupled to the heat pipe through the hinge.

7. The assembly of claim 1, further comprising a clip configured to maintain a pressure of the cold plate and the thermal interface over the circuit card.

8. The assembly of claim 1, wherein the circuit includes one of a dual in-line memory module or other similar memory or storage devices.

9. The assembly of claim 1, wherein the circuit card comprises a symmetric board including like circuits on opposite sides of the circuit card.

10. The assembly of claim 1, wherein the thickness of the thermal interface is selected based on a profile of the circuit and a selected heat transfer rate.

11. A chassis, comprising:
a liquid manifold;
multiple circuit cards having a vertical connector to fit into multiple sockets on the chassis; and
multiple assemblies configured to receive the circuit cards, each of the assemblies comprising:
a heat pipe coupled to a heat transfer device;
a thermal interface;
a cold plate rotatably coupled with the heat pipe through a hinge; and
a second thermal interface coupled with a second cold plate, the second cold plate rotatably coupled with a second heat pipe, wherein the cold plate, and the second cold plate, are configured to press on one of the circuit cards of the circuit cards when they rotate against each other, and the second thermal interface is configured to make thermal contact with multiple chips on a surface of the one of the circuit cards, wherein:
the thermal interface is coupled with the cold plate through a plane to rotate about the heat pipe together with the cold plate,
the thermal interface comprises a material having a thickness and a resiliency configured to make thermal contact with a circuit in the one of the circuit cards, and
the one of the circuit cards is inserted in a socket and is configured to make thermal contact, on each of two opposite sides, with a thermal interface of each of two assemblies.

12. The chassis of claim 11, wherein the one of the circuit cards is removably coupled to one of the sockets and a respective thermal interface coupled to a respective cold plate in each of the two assemblies are configured to rotate in opposite directions about a respective heat pipe to allow for an insertion and a removal of the one of the circuit cards.

13. The chassis of claim 11, wherein the liquid manifold is coupled to a pump configured to provide a liquid flow to transfer heat from the heat pipe.

14. The chassis of claim 11, wherein each assembly further comprises a clip configured to maintain a pressure of the cold plate and the thermal interface over the one or the circuit cards.

15. The chassis of claim 11, wherein the one of the circuit cards comprises a memory array including multiple volatile and non-volatile memory circuits comprising a dynamic random access memory and a NAND flash memory.

16. The chassis of claim 11, wherein in each of the assemblies, the heat pipe is fluidically coupled with the heat transfer device.

17. The chassis of claim 11, wherein in each of the assemblies, the cold plate is thermally coupled to the heat pipe through the hinge.

18. The chassis of claim 11, wherein in each of the assemblies, the thickness of the thermal interface is selected based on a profile of the circuit and a selected heat transfer rate.

19. The chassis of claim 11, wherein the one of the circuit cards comprises a symmetric board including like circuits on opposites sides of the one of the circuit cards.

\* \* \* \* \*